United States Patent
McGinniss et al.

(10) Patent No.: US 7,217,491 B2
(45) Date of Patent: May 15, 2007

(54) ANTIREFLECTIVE COATINGS

(75) Inventors: Vincent D. McGinniss, Sunbury, OH (US); Steven M. Risser, Reynoldsburg, OH (US); Jeffrey T. Cafmeyer, Columbus, OH (US); James L. White, Columbus, OH (US); Bhima R. Vijayendran, Dublin, OH (US)

(73) Assignee: Battelle Memorial Institute, Columbus, OH (US)

( * ) Notice: Subject to any disclaimer, the term of this patent is extended or adjusted under 35 U.S.C. 154(b) by 21 days.

(21) Appl. No.: 10/455,095

(22) Filed: Jun. 5, 2003

(65) Prior Publication Data
US 2004/0023156 A1 Feb. 5, 2004

Related U.S. Application Data

(60) Provisional application No. 60/387,149, filed on Jun. 7, 2002.

(51) Int. Cl.
*G03F 7/004* (2006.01)
(52) U.S. Cl. ............................ 430/270.1; 430/271.1; 430/910
(58) Field of Classification Search ............. 430/270.1, 430/271.1, 910
See application file for complete search history.

(56) References Cited

U.S. PATENT DOCUMENTS

| | | | |
|---|---|---|---|
| 4,544,691 A | 10/1985 | Dexter et al. | |
| 5,324,788 A * | 6/1994 | Kuo | 525/329.5 |
| 5,597,868 A | 1/1997 | Kunz | |
| 6,042,990 A | 3/2000 | Shao et al. | |
| 6,080,530 A | 6/2000 | Shao et al. | |
| 6,156,479 A | 12/2000 | Meador et al. | |
| 6,165,684 A | 12/2000 | Mizutani et al. | |
| 6,190,839 B1 | 2/2001 | Pavelchek et al. | |
| 6,268,457 B1 | 7/2001 | Kennedy et al. | |

FOREIGN PATENT DOCUMENTS

JP 11171887 A * 6/1999

OTHER PUBLICATIONS

English language abstract of JP 11-171887.*
Jim D. Meador et al.; Recent Progress in 193 nm Antireflective Coatings; SPIE; Feb. 26, 1999; pp. 800-809; vol. 3678.
Handbook of Microlithography, Micromachining, and Microfabrication, vol. 1: MICROLITHOGRAPHY; pp. 366-368; SPIE Optical Engineering Press; Bellingham, Washington, USA.
Sorenson, Wayne R.: Preparative Methods of Polymer Chemistry; Interscience Publishers, Inc.; New York; 1961; E.I. du Pont de Nemours & Company, Inc.

* cited by examiner

*Primary Examiner*—Amanda Walke
(74) *Attorney, Agent, or Firm*—Klaus H. Wiesmann

(57) ABSTRACT

An antireflective coating composition including a polyester and/or a polyurethane; and a crosslinker selected from the group consisting of tetraamidomethyl ethers.

11 Claims, 1 Drawing Sheet

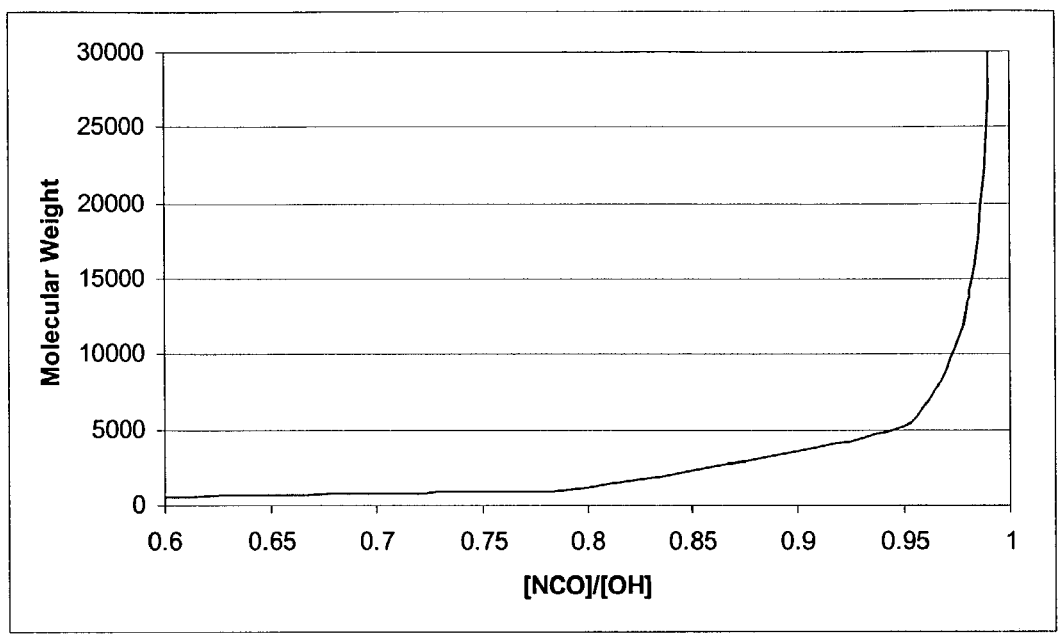
FIGURE

ANTIREFLECTIVE COATINGS

This application claims the benefit of U.S. Provisional Application Ser. No. 60/387,149, filed Jun. 7, 2002. The entire disclosure of this provisional application is incorporated herein by reference as if fully rewritten herein.

FIELD OF THE INVENTION

The invention relates to antireflective coatings useful for making semiconductor microcircuits. The antireflective coatings are particularly useful at wavelengths of less than 200 nm.

BACKGROUND OF THE INVENTION

As deep ultraviolet lithography becomes widely practiced for producing smaller and smaller microcircuits, e.g. 0.20 µm and smaller, anti-reflective coatings have become essential for improved process designs. These materials provide improved resolution and better critical dimension control by minimizing standing waves and reflective interferences from the substrate.

Antireflective coatings applied at the substrate-resist interface are called bottom antireflective coatings. The ones applied at the resist-air interface are called top antireflective coatings.

Organic antireflective coatings typically work by matching refractive index of the film with that of the photoresist. If there is no change in the refractive index at the antireflective coating and resist interface, there will be no reflection. The organic layers may also be designed to absorb light, so that light that penetrates the antireflective coating is absorbed before it reaches the next interface.

Currently, semiconductor manufacturers use both organic and inorganic antireflective coatings. While either of these classes offers some distinct property advantages, the organic materials offer advantageous spin coating characteristics. Since photo resists and low k dielectrics are applied by spin coating, the antireflective coatings are preferably applied by the same methods. The present inventive materials can be applied by the spin coating techniques.

BRIEF DESCRIPTION OF THE INVENTION

Broadly, the invention includes an antireflective coating composition including a polymer selected from the group consisting of a polyester, and a polyurethane; and a crosslinker selected from the group consisting of tetraamidomethyl ether. Typically the tetraamidomethyl ether comprises Gecko™.

In one embodiment, the invention includes an antireflective, light attenuating, photolithography polymer of a polyurethane having isocyanate groups reacted with alcohol groups, wherein the ratio of —NCO/—OH groups is between about 0.6 to about 0.95.

Another aspect of the invention includes a method for making an antireflective, light attenuating, photolithography polymer composition by the steps of reacting a monomer having an isocyanate group with a monomer having an alcohol group, wherein the molar ratio of the isocyanate group to the alcohol group is between about 0.6 and about 0.95 to form a polyurethane; and reacting the polyurethane with a tetraamidomethyl ether crosslinker. Preferable molar ratios of the isocyanate group to the alcohol group are between about 0.7 and about 0.85.

In another embodiment, polyester is dissolved in a solvent and reacted with a crosslinking solution containing a tetraamidomethyl ether crosslinker.

Typically, the product solutions are spin coated onto a wafer (e.g. silicon wafer) and measured for coating thickness, optical density or absorbance at selected wavelengths (e.g. 365 nm, 248 nm, 193 nm, 157 nm). Other important properties such as etch rate, molecular weight, P.D., $T_D$, $T_g$ can also be determined.

BRIEF DESCRIPTION OF THE DRAWING

The FIGURE is a graph illustrating the effect of the NCO/OH ratio (horizontal scale) on the Molecular Weight (vertical scale) of the resultant polymer. The molecular weight is the theoretical molecular weight in g/mol.

DETAILED DESCRIPTION OF THE INVENTION AND BEST MODE

Requirements for successful anti-reflective coatings can be broadly grouped into three categories:
(1) wavelength absorption (or reflectance);
(2) adhesion; and
(3) removal.

The present invention obtains these functionalities by imbedding them directly onto a polymer backbone. Imbedding of the functionalities directly on the polymer backbone improves lot-to-lot consistency over other methods. The polymers may be either homopolymers or copolymers.

The materials of the invention are particularly useful in that the individual components can be selected to improve the ability of the final antireflective coating material to meet several conflicting design needs such as optical density, plasma etch rate, solvent compatibility, and substrate adhesion.

The materials of the invention contain specific monomers that absorb light at wavelengths below 200 nm, such as at about 193 nm and down to about 157 nm. The specific monomers are provided at the required number density to give the appropriate optical density. Number density is defined as the number of the specific monomer or chromophore per cubic centimeter. The number density of the absorbing monomer or chromophore is directly related to the optical density of the material. Materials that absorb at other wavelengths can be obtained by replacing the functional groups (e.g. acrylates, aromatics) or chromophores by others with the desired absorption characteristics.

Monomers with high optical density typically have low plasma etch rates. The present invention contains one or more polymer components that are selected to provide enhanced plasma etch rates. These polymer components are heterocycles, urethanes, esters, or aromatics.

The compatibility of the polymer systems of the present invention with standard or selected fabrication solvents, and the adhesion of the polymer system to the substrate can be modified. Modification of these properties can be achieved by altering the ratio of the component monomers, or by including a small amount of solubilizing agent or adhesion promoter. Examples include, inclusion of a silane monomer to enhance adhesion to the substrate, or inclusion of a styrene monomer to improve flow and conformality. Other examples include the addition of non-carbon atom content of the polymer to modify the properties of antireflective coatings. Oxygen, silicon, nitrogen, and/or halogen atoms can be added to achieve the selected non-carbon atom content.

General Preparation of Polyesters Useful with the Invention

The following branched polyesters are useful with the invention: polyesters based on multifunctional acids or alcohols, dendritic polyols, and combinations of polyethers, polyurethanes and other polyesters that are nonlinear in their nature.

The initial trials for making a polyester resin that would fit the requirements for a useful antireflective coating presented problems. This was because the total functionality of a typical formulation is capable of directly causing crosslinking. Intra-esterification and anhydride formation occur to a small extent along with the primary reaction of inter-esterification. In practice, the polycondensation is taken just far enough to provide a polyester that is still fusible and soluble. Kienle et al found that in a glycerol and phthalic anhydride reaction that gelation can occur when as little as 75 percent esterification has occurred (Sorenson Wayne R. et al; "Preparative Methods of Polymer Chemistry", Interscience Publishers, New York; p. 289 (1961)). It was determined that a low molecular weight polymer can form a gel if the reaction is stopped at the right time. If the reaction continues beyond the critical gel point, it forms giant molecules. It is imperative to control the reaction to stop when the gelling has reached a suitable concentration of a highly complex formulation.

Consequently, the rate of temperature control is important as well as the duration at which the formulation is held at temperature (e.g. about 1 to about 3 degree/minute, held for about 1 to about 2 hours). The gel consistency or viscosity in these experiments was used to determine when it was the right time to stop the reaction. After experiments of adjusting the rate of temperature and the consistency of the gel, it was found that a temperature rise of about two (2) degrees per minute with a hold time of about 1.5 hours, and a final viscosity close to that of a typical pancake syrup (at room temperature) generated the best polyester. If the holding time is too long then the mixture will gel due to advanced three dimensional polymerization reactions. The viscosity is typically in a range of about 1 Poise to 1000 Poise, and most preferably in a range of about 4 Poise to 100 Poise. Viscosity in the present case is measured by the method of Gardner-Holt.

In a typical method for preparing branched polyesters useful with the invention, the following general steps may be used:

Phthalic anhydride and glycerol are mixed and stirred at a temperature of about 100° C. to 200° C. The mixture is stirred and the temperature of the silicone oil raised to about 150° C. to about 200° C. (preferably about 200° C.). This temperature is maintained for about 1 to about 2 hr. The acid value should be about 127-132, determined in acetone. At this point, the product is still soluble in acetic acid, acetone, and other similar solvents. The product is then quickly cooled to room temperature and allowed to stand for about 1 to about 3 hours (preferably about 2 hours) at about 25° C. (room temperature) before dissolving into a solvent for spin coating and evaluation.

For those interested in a general description on how to prepare 30 polyesters, reference is made to the publication by Sorenson, Wayne R. and Campbell, Tod W.; "Preparation Methods of Polymer Chemistry"; Campbell Interscience Publisher, New York, N.Y., pp. 290+; (1961). This publication is hereby incorporated by reference.

Polyesters useful with the invention are further reacted with groups that provide the desired antireflective properties. For example, the resulting polyester is then dissolved in a solution selected from the group consisting of ethyl lactate, propylene glycolmonoethyl ether, or acetone and crosslinked with a crosslinking stock solution selected from the group consisting of Gecko™ in propylene glycolmonoethyl ether or other melamine/urea modified ether crosslinking agents. To this one can add a catalyst selected from dodecylbenezenesulfonic acid, its amine salt or from an amine salt of an aromatic sulfonic ester. Typically the catalyst is Nacure 5225™ and the like.

This solution is then spin coated onto a substrate or on a selected layer of a precursor semiconductor device (e.g. silicon wafer). One or more additional material layers may be added over the antireflective coating after which the device is exposed to light and an etchant.

Typically the polyesters useful with the invention have a molecular weight of about 1000 to about 5000; preferably about 1200 to about 2500.

General Preparation of Polyurethanes Useful with the Invention

Typically polyurethanes useful with the invention have the following properties: toughness, flexibility, optical clarity, adhesion, and crosslinking capabilities.

Typically, a melted diisocyanate is added to a flask containing an unsaturated diol compound selected from the list consisting of alkene diols (e.g. 2-Butene, 1,4 diol) and saturated glycols selected from the list consisting of ethylene glycol, propylene glycol, diethylene glycol, or other similar glycols. The materials are mixed and heated to a temperature of about 50° C. to about 150° C. for about 10 to 15 minutes. Thereafter, a catalyst is added selected from the list consisting of tin compounds (e.g. one drop (about 0.10 mg) of dibutyl tin dilaurate). The reaction will become exothermic and the materials will solidify. The flask is then cooled and the solids removed for analysis and evaluation. Typical diisocyanates useful in the above reaction are selected from the list consisting of toluene diisocyanate, methylene diisocyanate, isopherone diisocyanate, and combinations thereof.

For those interested in a general description on how to prepare polyurethanes, please refer to the reference by Sorensen and Campbell, cited immediately above, in Example 1, see pp. 110+.

Typically, polyurethanes from the examples or others useful with the invention are dissolved in ethyl lactate and the like, which solution is then combined with a crosslinking stock solution consisting of a methylolated urea or melamine (e.g. Gecko™ in propylene glycolmonoethyl ether). To this is added sufficient catalyst such as an aromatic sulfonic acid, typically dodecylbenzenesulfonic acid, (e.g. Nacure 5225™) to complete the reaction. Typically crosslinking agents such as methylolated ureas are useful with the invention. Catalysts useful with the invention may be selected from the group consisting of an aromatic sulfonic acid, typically a dodecylbenzenesulfonic acid.

This solution can be spin coated onto a substrate such as a silicon wafer and measured for coating thickness and optical density or absorbance at 193 nm. The optical density (OD) for the film is preferably between about 8 to about 15 and the etch rate is preferably above about 700 Å/min.

One or more additional material layers may be added over the antireflective coating after which the device is exposed to light and an etchant.

Typically the polyurethanes useful with the invention have a molecular weight of about 1000 to about 20,000 and viscosity ranges are the same as for the polyester resins.

The most important factor in step-growth or condensation polymerizations is the stoichiometry of the reagents (the ratio of the reactive functionality). Typically, a difunctional reagent of functionality A is reacted with a complementary difunctional reagent of functionality B. In the present invention for the preparation of a polyurethane, isocyanate groups (functionality A) are reacted with alcohol groups (functionality B). When the ratio of isocyanate to alcohol becomes very close to unity (NCO/OH>0.99), high polymer is formed and the number of end groups of the polymer chains becomes insignificant. At lesser ratios, there is an excess of alcohol that limits the theoretical average molecular weight as the available isocyanate is consumed and the resulting molecules are effectively terminated with alcohol functionality. In the present invention, a specific concentration of alcohol groups is desired for further reaction with a crosslinking molecule. In order to reach a desired concentration of alcohol functionality in a conventional step-growth polymer, the amount of alcohol reagent can be increased although this will limit the ultimate molecular weight of the polymer.

This procedure to modify the alcohol content was used in the formulations in the polyurethane examples provided. Referring now to the FIGURE, the drawing illustrates a graph of a molecular weight profile of a polyurethane as a function of the NCO/OH ratio. The graph illustrates the effect of the NCO/OH ratio on molecular weight.

Other strategies, such as protective group chemistry, may be employed in order to increase the effective alcohol content without lowering the overall molecular weight. This includes using a di-protected triol to endcap the polymer chains. Once the polymer is formed, the protecting groups can be removed and the amount of alcohol at the chain ends would be effectively doubled. Using a mono-protected triol, a polymer containing pendant alcohol functionality along the chain would be produced after a deprotection reaction.

The following specific examples are merely illustrative of the invention and are not meant to limit the invention in any way.

EXAMPLE 1

Branched Polyester

In a 600 ml beaker immersed in silicone oil, and equipped with a thermometer and stirrer were placed 148.1 g (1.0 mole) phthalic anhydride and 61.4 g (0.67 mole) glycerol. The mixture was stirred and the temperature of the silicone oil was raised to about 200° C. This temperature was maintained for 1.5 hr. The acid value obtained was about 127-132, determined in acetone. At this point, the product was still soluble in acetic acid, acetone, and other similar solvents.

The product was then quickly cooled and allowed to stand for about two hours at room temperature before dissolving into a solvent for spin coating and evaluation.

For those interested in a general description on how to prepare polyesters, reference is made to the publication by Sorenson, Wayne R. and Campbell, Tod W.; "Preparation Methods of Polymer Chemistry"; Campbell Interscience Publisher, New York, N.Y., pp. 290+; (1961), the relevant text of which is incorporated by reference herein.

EXAMPLE 2

Polyurethane I 48817-1,2,3,4

Melted toluene diisocyanate (TDI) (20 g or 0.1149 moles) was added to a flask containing 5.62 g (0.063 moles) of 2-Butene 1,4 diol and diethylene glycol (6.77 g, 0.0638 moles) under mixing and heating for 50° C. to 150° C. One drop (about 0.10 mg) of dibutyl tin dilaurate was added and the reaction became exothermic and the product solidified. The flask was cooled and the solids were removed for analysis and evaluation. The product is typically further reacted for spin coating.

For those interested in a general description on how to prepare polyurethanes, please refer to the reference by Sorensen and Campbell, cited immediately above, in Example 1, see pp. 110+, the relevant text of which is incorporated by reference herein.

EXAMPLE 3

Polyurethane Samples II to X

Further examples for the production of polyurethanes for this invention are described in Table 1 below.

TABLE 1

Production of Additional Polyurethanes

| Polyurethane Sample No. (Roman numeral) NCO/OH Ratio | Amount of diisocyanate TDI[a] or MDI[b] (moles) | Amount of unsaturated diol (moles) | Amount of other diols DEG[c] (moles) |
|---|---|---|---|
| II<br>NCO/OH = 0.718 | TDI (0.1150) | Butene diol (0.08) | DEG (0.08) |
| III<br>NCO/OH = 0.9 | TDI (0.0574) | — | DEG (0.0638–0.645) |
| IV<br>NCO/OH = 0.9 | TDI (0.0574) | Butene diol (0.0638) | — (0) |
| V<br>NCO/OH = 0.9 | MDI (0.04) | Butene diol (0.0222) | DEG (0.0221) |
| VI<br>NCO/OH = 0.9 | MDI (0.0574)<br>TDI (0.0574) | Butene diol (0.0769) | DEG (0.0530) |
| VII<br>NCO/OH = 0.9 | MDI (0.0861)<br>TDI (0.0287) | Butene diol (0.0769) | DEG (0.0536) |
| VIII<br>NCO/OH = 0.7 | MDI (0.0860)<br>TDI (0.0288) | Butene diol (0.0822) | DEG (0.0825) |
| IX<br>NCO/OH = 0.7 | MDI (0.0574)<br>TDI (0.0574) | Butene diol (0.0823) | DEG (0.0821) |
| X<br>NCO/OH = 0.7 | MDI (0.0287)<br>TDI (0.0862) | Butene diol (0.0822) | DEG (0.0819) |

[a]TDI = Toluene Diisocyanate
[b]MDI = Methylene Diisocyanate
[c]DEG = Diethyleneglycol Reaction conditions for the above reactions were the same as previously discussed.

EXAMPLE 4

Polyester Formulations

The polyester (0.5730 g) from Example 1 was dissolved in 5.2 g ethyl lactate, which was combined with 0.2865 g of a crosslinking stock solution (0.25 g Gecko™ in 2.5 g propylene glycolmonoethyl ether). To this was added 0.006 g of a catalyst (Nacure 5225™).

This solution was spin coated onto a silicon wafer and measured for coating thickness and optical density or absorbance at 193 nm. The optical density (OD) for the film was 14.8 and the etch rate was 933 Å/min. The molecular weight ($M_w$) was 6,089 and the P.D was 3.15. $T_d$ (5% weight loss) was about 200° C. $T_g$ was not determined. Optical loss (k) was found to be about 0.56.

EXAMPLE 5

Polyurethane Formulations

Similar experiments were carried out for the polyurethane materials as were carried out for the polyester and the results are shown in Tables 2 and 3.

Typically, polyurethanes from the examples or others useful with the invention are dissolved in ethyl lactate, which is combined with a crosslinking stock solution consisting of Gecko™ in propylene glycolmonoethyl ether. To this was added sufficient catalyst (e.g. Nacure 5225™) to complete the reaction.

This solution can be spin coated onto a silicon wafer and measured for coating thickness and optical density or absorbance at 193 nm. The optical density (OD) for the film is preferably between about 7 to about 11 and the etch rate is above about 700 Å/min and preferably above about 800 Å/min.

TABLE 2

Optical Density and Etch Rate for Three Polyurethane Samples

| Polyurethane | Optical Density | Etch Rate (Å/min) |
| --- | --- | --- |
| 48817-4 | 8.6 | 896 |
| 48817-15 | 10.5 | 879 |
| 48817-16 | 9.2 | 912 |

TABLE 3

Molecular Weight, $T_d$ (5% wt. loss)/$T_g$ (° C.), and k for Three Polyurethane Samples

| Polyurethane | Molecular Wt. ($M_W$) | $T_d$ (5% wt. loss)/$T_g$ (° C.) | k |
| --- | --- | --- | --- |
| 48817-4 | 7,482 | 255/78 | 0.3 |
| 48817-15 | 2,776 | 225/nd | 0.38 |
| 48817-16 | 2,623 | 225/nd | 0.32 | nd-not determined

Gecko™ is a tetra-amidomethyl ether crosslinking agent Product code # 01720, obtained from Shipley Company, Marlboro, Mass. 01752, USA, (a Rohn and Haas Company). Nacure 5225™ is an amine salt of an aromatic sulfonic acid in isopropanol and was obtained from King Industries, Norwalk, Conn., USA.

The antireflective coatings of the invention may be applied by standard spin coating techniques. Preferably they are applied at spin speeds of about 5000 to about 6000 rpm for about 30 to about 40 seconds. Following spin application they are dried, typically by oven drying.

While the forms of the invention herein disclosed constitute presently preferred embodiments, many others are possible. It is not intended herein to mention all of the possible equivalent forms or ramifications of the invention. It is to be understood that the terms used herein are merely descriptive, rather than limiting, and that various changes may be made without departing from the spirit of the scope of the invention

We claim:

1. An antireflective, light attenuating, photolithography polymer comprising: a polyurethane comprising isocyanate groups reacted with alcohol groups, wherein the ratio of —NCO/—OH groups is between about 0.6 to about 0.95 and wherein the polyurethane is crosslinked with a tetraamidomethyl ether crosslinking agent.

2. The polymer according to claim 1, wherein the ratio of —NCO/—OH groups is between about 0.7 to about 0.85.

3. A method for making an antireflective, light attenuating, photolithography polymer composition comprising:
   a. reacting a monomer having at least two isocyanate groups with a monomer having at least two alcohol groups, wherein the molar ratio of the isocyanate groups to the alcohol groups is between about 0.6 and about 0.95, to form a polyurethane; and
   b. reacting the polyurethane with an effective amount of a tetraamidomethyl ether crosslinker.

4. The method according to claim 3, including the step of,
c. reacting the polyurethane and crosslinker in the presence of a catalyst.

5. The method according to claim 4, wherein the catalyst is chosen from the group consisting of an aromatic sulfonic acid and an amine salt of an aromatic sulfonic acid.

6. The method according to claim 3, wherein the monomer is a diisocyanate selected from the group consisting of TDI, MDI, and mixtures thereof.

7. The method according to claim 4, including the step of coating the polymer, crosslinker, and catalyst onto a substrate.

8. A semiconductor comprising the polymer of claim 1.

9. An antireflective, light attenuating, photolithography polymer comprising:
   a polyurethane comprising isocyanate groups reacted with alcohol groups, wherein the ratio of —NCO/—OH groups is between about 0.6 to about 0.95 and wherein the polyurethane is crosslinked with a crosslinker selected from the group consisting of a melamine modified ether and a urea modified ether.

10. A semiconductor comprising the polymer of claim 9.

11. The method of claim 3, wherein the alcohol monomer comprises partially-blocked hydroxyl groups.

* * * * *